United States Patent
Sakamoto et al.

(10) Patent No.: US 7,757,110 B2
(45) Date of Patent: Jul. 13, 2010

(54) TIMER CIRCUIT THAT BYPASSES FREQUENCY DIVIDER IN RESPONSE TO RECEIVING SHORT-TIME MODE INSTRUCTION ON DUAL-FUNCTION EXTERNAL TERMINAL

(75) Inventors: Koichiro Sakamoto, Atsugi (JP); Junji Takeshita, Atsugi (JP); Takashi Takeda, Atsugi (JP)

(73) Assignee: Mitsumi Electric Co., Ltd., Tokyo (JP)

(*) Notice: Subject to any disclaimer, the term of this patent is extended or adjusted under 35 U.S.C. 154(b) by 777 days.

(21) Appl. No.: 11/646,694

(22) Filed: Dec. 28, 2006

(65) Prior Publication Data
US 2007/0183270 A1  Aug. 9, 2007

(30) Foreign Application Priority Data
Jan. 31, 2006  (JP) ............... 2006-023601

(51) Int. Cl.
*G06F 1/04* (2006.01)
(52) U.S. Cl. ........................... 713/500; 327/82

(58) Field of Classification Search ............... 713/500; 327/82
See application file for complete search history.

(56) References Cited

U.S. PATENT DOCUMENTS

| 4,001,553 A | * | 1/1977 | Troutman et al. | 377/29 |
| 4,104,542 A | * | 8/1978 | Karklys et al. | 307/141 |
| 4,270,573 A | * | 6/1981 | Sturman et al. | 137/624.2 |

FOREIGN PATENT DOCUMENTS

JP  11-265734  9/1999

* cited by examiner

*Primary Examiner*—Albert Wang
(74) *Attorney, Agent, or Firm*—Ladas & Parry LLP

(57) ABSTRACT

A disclosed timer circuit for clocking a predetermined time includes an oscillator and a frequency dividing unit for dividing a frequency of an oscillating signal output from the oscillator. A comparing unit determines whether a short-time mode instruction is received by comparing a voltage received at an external terminal with a predetermined voltage. A switch causes the oscillating signal to bypass a part of the frequency dividing unit in response receiving the short-time mode instruction.

4 Claims, 2 Drawing Sheets

TIMER CIRCUIT THAT BYPASSES FREQUENCY DIVIDER IN RESPONSE TO RECEIVING SHORT-TIME MODE INSTRUCTION ON DUAL-FUNCTION EXTERNAL TERMINAL

BACKGROUND OF THE INVENTION

1. Field of the Invention

The present invention relates generally to timer circuits, and more particularly to a timer circuit that clocks a predetermined time by dividing a frequency of an oscillating signal output from an oscillator.

2. Description of the Related Art

A charge controller is connected between a direct-current power supply such as an AC adapter or a USB port and a secondary battery such as a lithium-ion battery, and controls an operation of charging the secondary battery.

FIG. 3 is a block diagram of an example of a conventional charge controller 1. The charge controller 1 is configured of a semiconductor integrated circuit, and is connected between a direct-current power supply 2 and a secondary battery 3. In the charge controller 1, a charge control unit 4 controls a charge current flowing through a transistor 5. A timer circuit 6 clocks the time from when charging starts. For example, when the voltage of the secondary battery 3 does not exceed a predetermined voltage and charging is uncompleted even after the passage of a predetermined time such as four hours, it is determined that the secondary battery 3 is abnormal (e.g., deteriorated). Accordingly, the charge control unit 4 stops the charging operation.

Patent document 1 discloses a technology in which a switch is provided between a secondary battery and a constant-voltage circuit. Voltage between a constant-current circuit and the constant-voltage circuit is monitored. When the monitored voltage reaches an open-circuit voltage of the constant-voltage circuit, a control circuit stops the charging operation.

Patent document 1: Japanese Laid-Open Patent Application No. H11-265734

Conventionally, when checking operations of a charge controller in a manufacturing process, it takes a long time to check the operations of the timer circuit 6. A conceivable measure for reducing the time required for checking operations of the timer circuit 6 is to accelerate clock signals used by the timer circuit 6, i.e., increase the frequency of the clock signals.

In order to accelerate the clock signals, an element such as a condenser can be externally attached to an external terminal of the semiconductor integrated circuit functioning as the charge controller. The attached element is used for determining the time constant of an oscillator that generates the clock signals. When the charge controller is used under normal conditions, the element (condenser) used for checking operations of the charge controller can be replaced with another element. However, in order to provide such an element, the external terminal needs to be added to the semiconductor integrated circuit. When circumstances do not allow for an external terminal to be added to the semiconductor integrated circuit, this measure cannot be realized.

SUMMARY OF THE INVENTION

The present invention provides a timer circuit in which one or more of the above-described disadvantages is eliminated.

A preferred embodiment of the present invention provides a timer circuit capable of reducing time required for checking operations of a charge controller without requiring an external terminal.

An embodiment of the present invention provides a timer circuit for clocking a predetermined time, including an oscillator configured to output an oscillating signal; a frequency dividing unit configured to divide a frequency of the oscillating signal output from the oscillator; an external terminal configured to receive from outside a voltage within a predetermined range or a short-time mode instruction voltage that is outside the predetermined range; a comparing unit configured to determine whether a short-time mode instruction is received by comparing the voltage received at the external terminal with a predetermined voltage; and a first switch configured to switch a status of a part of the frequency dividing unit to a bypass status so as to be bypassed by the oscillating signal output from the oscillator, in response to the comparing unit determining that the short-time mode instruction is received.

According to one embodiment of the present invention, time required for checking operations of a charge controller can be reduced without requiring an external terminal.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of an embodiment of the present invention.

<Circuit Configuration>

Figure 1:
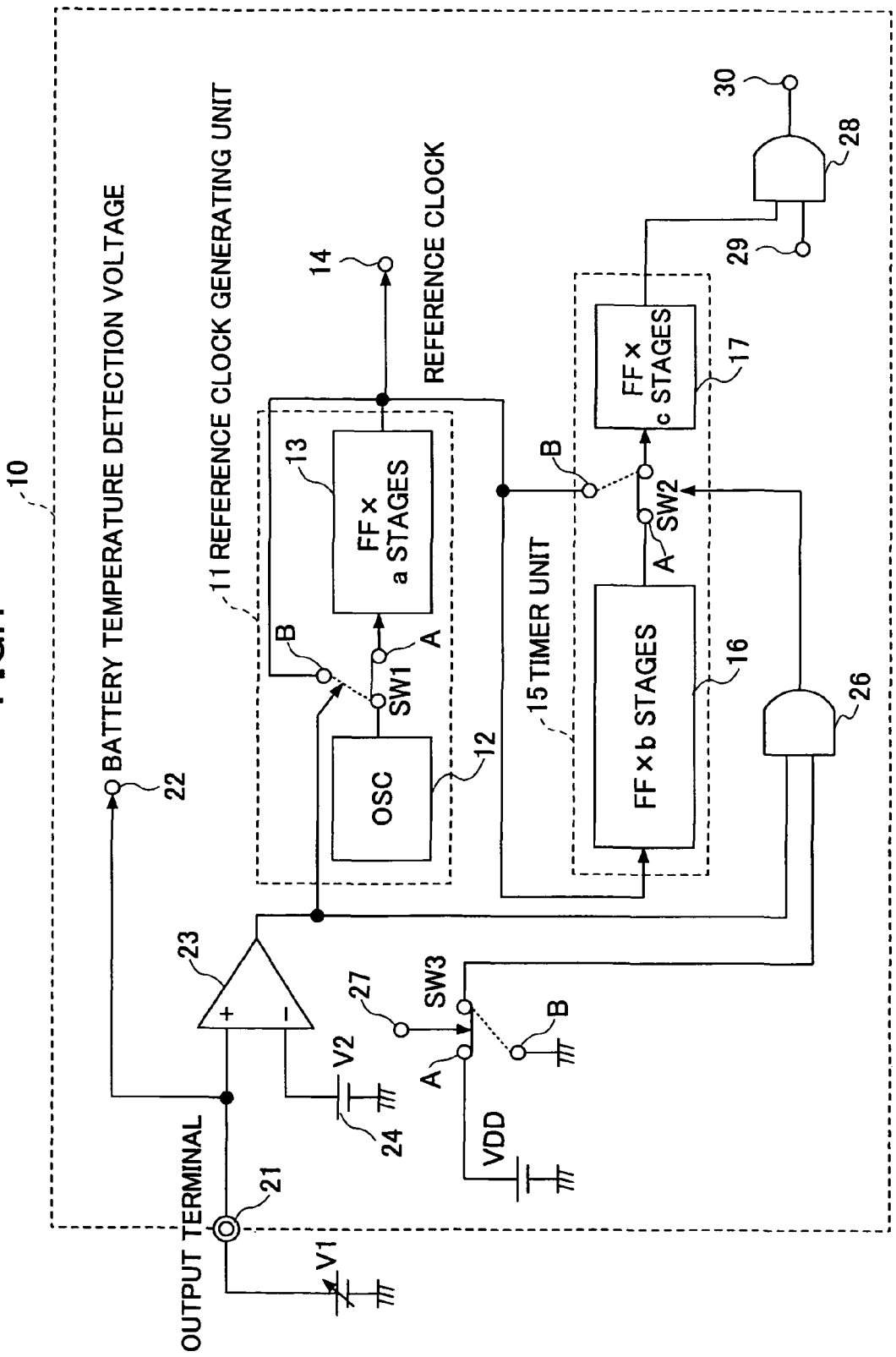
FIG. 1 is a circuit diagram of a timer circuit according to one embodiment of the present invention.
Figure 3:
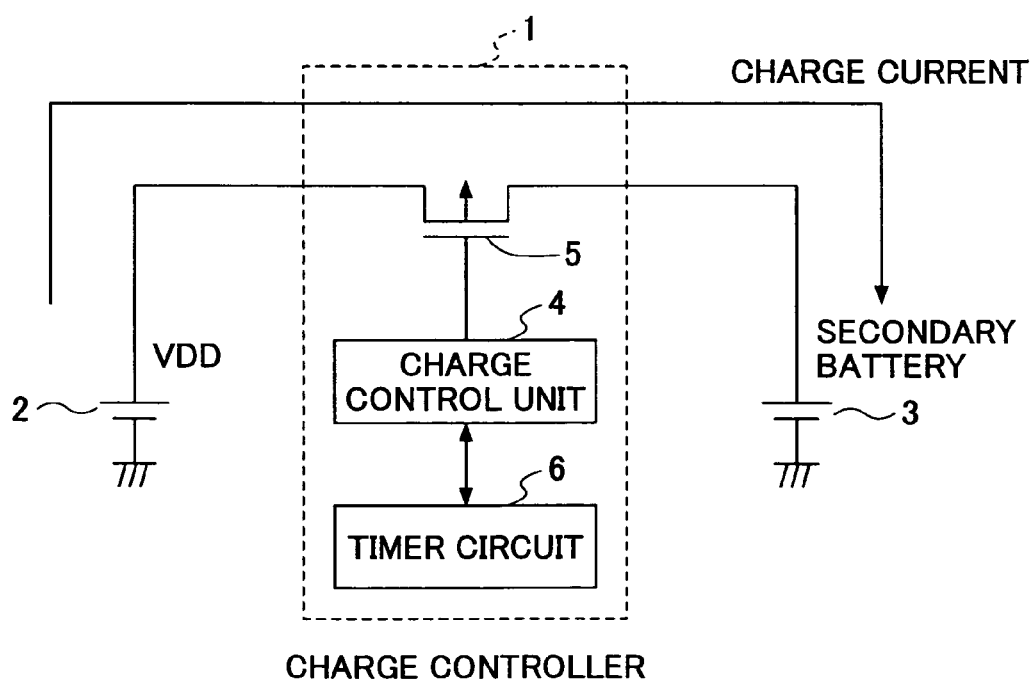
FIG. 3 is a block diagram of an example of a conventional charge controller.

FIG. 1 is a circuit diagram of a timer circuit according to one embodiment of the present invention. A semiconductor integrated circuit 10 shown in FIG. 1 includes the same charge controller as that shown in FIG. 3. A reference clock generating unit 11 and a timer unit 15 in the semiconductor integrated circuit 10 correspond to the timer circuit 6 shown in FIG. 3.

The reference clock generating unit 11 includes an oscillator (OSC) 12, a switch SW1, and a flip-flop (FF) unit 13. An oscillating signal output from the oscillator 12 is supplied to the switch SW1. In a normal mode, the switch SW1 supplies the oscillating signal from a terminal A to the flip-flop unit 13. In a short-time mode, the switch SW1 supplies the oscillating signal to a terminal B.

The flip-flop unit 13 includes a (e.g., a=10) stages of flip-flops that are cascade-connected. The flip-flop unit 13 divides the frequency of an oscillating signal to generate a reference clock. The reference clock is supplied to the timer unit 15. The reference clock is also supplied to another not shown circuit in the charge controller through an internal terminal 14. A terminal B of a switch SW2 in the timer unit 15 is connected to an output terminal of the flip-flop unit 13.

The timer unit 15 includes a flip-flop unit 16, the switch SW2, and a flip-flop unit 17. The flip-flop unit 16 includes b (e.g., b=16) stages of flip-flops that are cascade-connected. The flip-flop unit 16 divides the frequency of the reference clock supplied from the flip-flop unit 13, and supplies the resultant clock to the switch SW2.

A terminal A of the switch SW2 receives the clock output from the flip-flop unit 16, and the terminal B of the switch SW2 receives the reference clock output from the flip-flop unit 13. The switch SW2 selects either one of the clocks, and supplies the selected clock to the flip-flop unit 17. The flip-flop unit 17 includes c (e.g., c=3) stages of flip-flops that are cascade-connected. The flip-flop unit 17 divides the frequency of the clock received from the switch SW2, and outputs the resultant clock.

Figure 2:
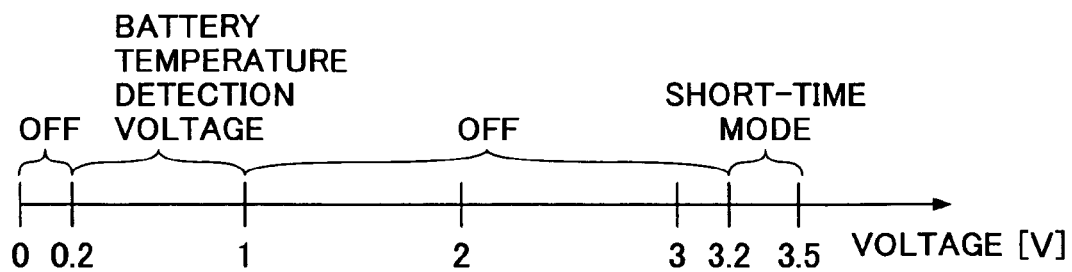
FIG. 2 is a diagram for describing a battery temperature detection voltage and a short-time mode instruction voltage.

An output terminal 21 of the semiconductor integrated circuit 10 receives a battery temperature detection voltage or a short-time mode instruction voltage from outside. For example, as shown in FIG. 2, the battery temperature detection voltage is in a range of 0.2 V-1.0 V and the short-time mode instruction voltage is in a range of 3.2 V-3.5 V. Therefore, when the received voltage is 1.0 V-3.2 V, i.e., in between the aforementioned two ranges, or when the voltage is below 0.2 V, the semiconductor integrated circuit 10 is not used (turned off).

A signal input to the output terminal 21 is supplied to a not shown battery temperature control circuit in the charge controller via an internal terminal 22, and is also supplied to a noninverted input terminal of a comparator 23. An inverted input terminal of the comparator 23 receives a predetermined voltage V2 (e.g., 3.2 V) from a reference voltage source 24. The comparator 23 compares the signal received at the non-inverted input terminal and the predetermined voltage V2 received at the inverted input terminal, and outputs a switching signal based on the comparison result. Specifically, the comparator 23 outputs a high-level switching signal only when a short-time mode instruction voltage is received at the output terminal 21, and outputs a low-level switching signal when a battery temperature detection voltage is received.

The switching signal is supplied to the switch SW1. When the switching signal is low-level, the switch SW1 outputs an oscillating signal from the terminal A. When the switching signal is high-level, the switch SW1 outputs an oscillating signal from the terminal B. The switching signal is also supplied to an AND circuit 26.

A terminal A of a switch SW3 receives a voltage VDD (high-level signal), and a terminal B of the switch SW3 is connected to ground (low-level signal). When an internal terminal 27 is floating, the terminal A is selected. When the internal terminal 27 is supplied with a predetermined voltage, the terminal B (low-level signal) is selected. The selected terminal supplies the corresponding signal to the AND circuit 26.

When a high-level signal is received from the switch SW3, the AND circuit 26 supplies the switching signal output from the comparator 23 to the switch SW2. When a low-level signal is received from the switch SW3, the AND circuit 26 supplies the low-level signal to the switch SW2.

The clock output from the flip-flop unit 17 is supplied to an AND circuit 28. When charging is in progress, the AND circuit 28 receives a high-level signal from an internal terminal 29. When charging is completed, the AND circuit 28 receives a low-level signal from the internal terminal 29. When charging is in progress, the AND circuit 28 supplies the clock received from the flip-flop unit 17 to a not shown succeeding circuit via an internal terminal 30.

<Operations>

Under normal operations, the output terminal 21 receives a battery temperature detection voltage, and the internal terminal 27 is floating. Therefore, both of the switches SW1 and SW2 are connected to their respective terminal A, the frequency of the oscillating signal output from the oscillator 12 is divided at the flip-flop units 13, 16, and 17 including cascade-connected flip-flops, a reference clock is output from the flip-flop unit 13, and the flip-flop unit 17 outputs, for example, a clock having a frequency of four hours.

When the semiconductor integrated circuit 10 is packaged as a product and operations thereof are checked, the output terminal 21 receives a short-time mode instruction voltage, and the internal terminal 27 is floating. Therefore, both of the switches SW1 and SW2 are connected to their respective terminal B, the oscillating signal output from the oscillator 12 bypasses the flip-flop units 13 and 16, the frequency of the oscillating signal output from the oscillator 12 is only divided at the flip-flop unit 17, and the flip-flop unit 17 outputs, for example, a clock having a frequency of one millisecond. Therefore, operations of the charge controller can be checked at high speed.

When the semiconductor integrated circuit 10 is in the form of wafers, operations of the charge controller are checked as follows. A probe of a test device is abutted against the output terminal 21 to supply a battery temperature detection voltage. The internal terminal 27 is floating so that the switches SW1 and SW2 are both connected to their respective terminal A. Under such a condition, a reference clock is output from the flip-flop unit 13 to test a not shown succeeding circuit. Accordingly, operations of the flip-flop unit 13 can be checked.

Further, when the semiconductor integrated circuit 10 is in the form of wafers, a probe of the test device is abutted against the output terminal 21 to supply a short-time mode instruction voltage. A probe is abutted against the internal terminal 27 to apply a predetermined voltage, so that the switch SW1 is connected to its terminal B while the switch SW2 is connected to its terminal A. Under such a condition, an oscillating signal output from the oscillator 12 only bypasses the flip-flop unit 13 (cancel the bypassing of the flip-flop unit 16, so that the flip-flop unit 16 is not bypassed), so that the frequency of the oscillating signal is divided at the flip-flop units 16 and 17. Accordingly, operations of the flip-flop units 16 and 17 can be checked.

In the claims, the flip-flop units 13, 16, and 17 correspond to a frequency dividing unit, the comparator 23 corresponds to a comparing unit, the switch SW1 corresponds to a first switch, the switch SW2 corresponds to a second switch, and the switch SW3 corresponds to a third switch.

The present invention is not limited to the specifically disclosed embodiment, and variations and modifications may be made without departing from the scope of the present invention.

The present application is based on Japanese Priority Patent Application No. 2006-023601, filed on Jan. 31, 2006, the entire contents of which are hereby incorporated by reference.

What is claimed is:

1. A timer circuit for clocking a predetermined time, comprising;

an oscillator configured to output an oscillating signal;

a frequency dividing unit configured to divide a frequency of the oscillating signal output from the oscillator;

an external terminal configured to receive from outside a voltage within a predetermined range or a short-time mode instruction voltage that is outside the predetermined range;

a comparing unit configured to determine whether a short-time mode instruction is received by comparing the voltage received at the external terminal with a predetermined voltage; and a first switch configured to switch a status of a part of the frequency dividing unit to a bypass status so as to be bypassed by the oscillating signal output from the oscillator, in response to the comparing unit determining that the short-time mode instruction is received.

2. The timer circuit according to claim 1 further comprising:

a second switch configured to cancel the bypass status of the part of the frequency dividing unit caused by the first switch.

3. The timer circuit according to claim 2, further comprising:

a third switch configured to operate the second switch.

4. The timer circuit according to claim 1, wherein the frequency dividing unit includes plural stages of flip-flops that are cascade connected.

* * * * *